United States Patent
Chen et al.

(10) Patent No.: US 7,148,120 B2
(45) Date of Patent: Dec. 12, 2006

(54) METHOD OF FORMING IMPROVED ROUNDED CORNERS IN STI FEATURES

(75) Inventors: Po-Jen Chen, Kaohsiung (TW); Jen-Hsiang Leu, Hsinchu (TW); Yan-Chang Liu, Taichung County (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/948,934

(22) Filed: Sep. 23, 2004

(65) Prior Publication Data

US 2006/0063348 A1   Mar. 23, 2006

(51) Int. Cl.
*H01L 21/762* (2006.01)
(52) U.S. Cl. ............... 438/421; 438/424; 257/E21.549
(58) Field of Classification Search ............... 438/424, 438/421, FOR. 227; 257/E21.549
See application file for complete search history.

(56) References Cited

U.S. PATENT DOCUMENTS

| 5,807,789 | A  | * | 9/1998  | Chen et al. ............... 438/714 |
| 6,258,676 | B1 | * | 7/2001  | Lee et al. .................... 438/296 |
| 6,500,727 | B1 | * | 12/2002 | Chen et al. .................. 438/424 |
| 6,593,207 | B1 | * | 7/2003  | Hong et al. .................. 438/424 |
| 6,746,936 | B1 | * | 6/2004  | Lee ............................ 438/445 |
| 2003/0139051 | A1 | * | 7/2003 | Andideh et al. ............ 438/692 |
| 2005/0153521 | A1 | * | 7/2005 | Kanamitsu et al. ......... 438/424 |

\* cited by examiner

*Primary Examiner*—George Fourson
(74) *Attorney, Agent, or Firm*—Tung & Assoc.

(57) ABSTRACT

A method for forming a shallow trench isolation (STI) structure with improved electrical isolation performance including providing a semiconductor substrate including an overlying silicon oxide layer on the semiconductor substrate and a hardmask layer on the silicon oxide layer; dry etching in a first etching process to form a patterned hardmask opening for etching an STI opening; dry etching in a second etching process the semiconductor substrate to form an upper portion of an STI opening to form a polymer layer along sidewall portions of the STI opening; and, dry etching in a third etching process the STI opening to form rounded bottom corners and rounded top corners.

20 Claims, 3 Drawing Sheets

METHOD OF FORMING IMPROVED ROUNDED CORNERS IN STI FEATURES

FIELD OF THE INVENTION

This invention generally relates to semiconductor processing methods and more particularly to a method for forming shallow trench isolation (STI) structures including improved rounded top and bottom corner profiles to avoid electrical charge leakage and improve electrical isolation in semiconductor devices.

BACKGROUND OF THE INVENTION

The art of electrically isolating semiconductor devices has become an increasingly difficult and important aspect in forming CMOS, DRAM, and SRAM devices including MOSFETS to ensure proper operation. Generally, every FET device must be electrically isolated from other devices to ensure that it operates without electrical interference from other devices. With the high integration of the semiconductor devices, improper electrical isolation among devices will cause current leakage, consuming a significant amount of power as well as compromising device functionality. Among some examples of reduced functionality include latch-up, noise margin degradation, Voltage threshold shift, cross-talk, and excessive power usage.

Shallow trench isolation (STI) is a preferred electrical isolation technique especially for ultra-large scale integration (ULSI) devices. STI structures allow devices to be placed closer together to achieve a higher level of circuit integration. The STI process generally involves forming trenches in a semiconductor substrate and backfilling with silicon oxide to electrically isolate adjacent active regions for subsequently forming FET devices.

In the STI formation techniques of the prior art, various methods have been proposed for achieving rounded STI trench upper (top) and bottom portions, as rounded corners have been found to decrease electrical field strengths and therefore current leakage. Prior art methods have included various etching strategies including the use of overlying photoresist patterned etching masks to dry etch the STI trench, as well as wet etching methods to form rounded top corners in the STI trench opening following dry etching of the STI trench. As integrated circuit characteristic dimensions continue to be scaled down, it has become increasingly difficult to form STI trench rounded corners with the desired profiles necessary to prevent current leakage. In addition, current leakage at or around STI features is increasingly sensitive to STI trench profiles as devices sizes scale down.

There is therefore a need in the integrated circuit manufacturing art to develop improved methods of forming shallow trench isolation (STI) structures to avoid the problem of undesirable current leakage including improved methods of forming STI trench top and bottom corner portions.

It is an object of the present invention to provide an improved method of forming shallow trench isolation (STI) structures to avoid the problem of undesirable current leakage including improved methods of forming STI trench top and bottom corner portions, in addition to overcoming other shortcomings of the prior art.

SUMMARY OF THE INVENTION

To achieve the foregoing and other objects, and in accordance with the purposes of the present invention, as embodied and broadly described herein, the present invention provides a method for forming a shallow trench isolation (STI) structure with improved electrical isolation performance.

In a first embodiment, the method includes providing a semiconductor substrate including an overlying silicon oxide layer on the semiconductor substrate and a hardmask layer on the silicon oxide layer; dry etching in a first etching process to form a patterned hardmask opening for etching an STI opening; dry etching in a second etching process the semiconductor substrate to form an upper portion of an STI opening to form a polymer layer along sidewall portions of the STI opening; and, dry etching in a third etching process the STI opening to form rounded bottom corners and rounded top corners.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

The method of the present invention is explained with respect to processing steps included in forming shallow trench isolation (STI) structures. It will be appreciated that the method of the present invention is particularly applicable to, but not limited to the formation of integrated circuits with characteristic dimensions less than about 0.25 microns, including less than about 0.13 microns. In addition, it will be appreciated that realized benefits of the present invention include avoiding electrical current (charge) leakage in a subsequently completed semiconductor device thereby improving subsequent device performance and reliability including device performance of CMOS, DRAM, SRAM and MOSFETS devices.

Figure 1A:
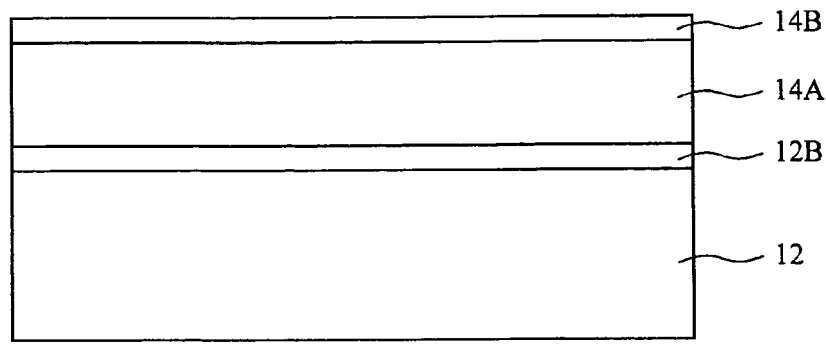
FIGS. 1A–1E are cross sectional side views of a portion of a semiconductor substrate at stages in manufacture of a shallow trench isolation (STI) structure according to an embodiment of the present invention.

In one exemplary implementation of the present invention, referring to FIG. 1A is shown a semiconductor substrate 12, for example silicon. For example, the substrate 12 may include, but is not limited to silicon, strained semiconductor, compound semiconductor, multi-layered semiconductors, or combinations thereof. The substrate 12 may include silicon, silicon on insulator (SOI), SiGe, GaAs, or combinations thereof. A pad oxide layer 12B of $SiO_2$ about 50 Angstroms to about 150 Angstroms is first thermally grown by conventional processes or formed by LPCVD TEOS over the silicon substrate 12 to aid in protecting the semiconductor substrate and reducing surface stresses induced in subsequent processing steps. One or more hardmask layers, e.g., 14A such as silicon nitride (e.g., $Si_3N_4$) and/or silicon oxynitride (e.g., SiON) is then deposited by a CVD method, for example LPCVD to a thickness of about 500 Angstroms to about 3000 Angstroms.

Still referring to FIG. 1A, an organic or inorganic anti-reflective coating (ARC) 14B, preferably an inorganic layer e.g., SiON is preferably formed over the hardmask layer 14A to a thickness of about 200 Angstroms to about 1000 Angstroms, to reduce light reflections in a subsequent photolithographic process.

Figure 1B:
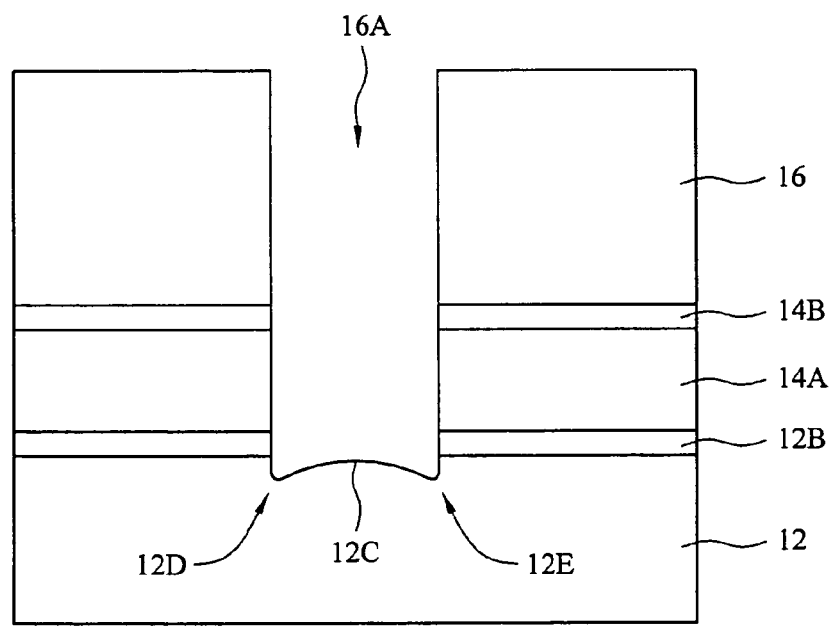

Referring FIG. 1B, a photoresist layer 16, e.g., 1000 to 6000 Angstroms in thickness is then formed over the ARC layer 14B and photolithographically patterned to form an opening exposing a portion of the ARC layer 14B for dry etching an opening 16A according to the patterned photoresist layer 16 through a thickness portion of the hardmask layer, e.g., 14A to form a dry etching hardmask for subsequent etching of an STI trench (opening). The opening 16A is etched to extend through the hard mask layer 14A and pad oxide layer 12B to preferably expose a portion of the substrate 12 according to a plasma assisted etch process e.g., a reactive ion etch (RIE) process, for example including a fluorocarbon etching chemistry, for example, $CF_4$. The ARC layer 14B and the silicon nitride hardmask layer 14A are anisotropically dry etched through a thickness to include the pad oxide layer 12B to form the opening 16A exposing a surface portion 12C of the substrate 12. Following the first etching process, the exposed surface 12C preferably includes a convex upward surface with a high point at about the center portion of the opening 16A and lowermost (recessed) portions e.g., 12D and 12E produced adjacent the opening sidewall. It will be appreciated that the first etching process may be carried out without completely removing the pad oxide layer 12B at the bottom center portion of the opening 16A.

Figure 1C:
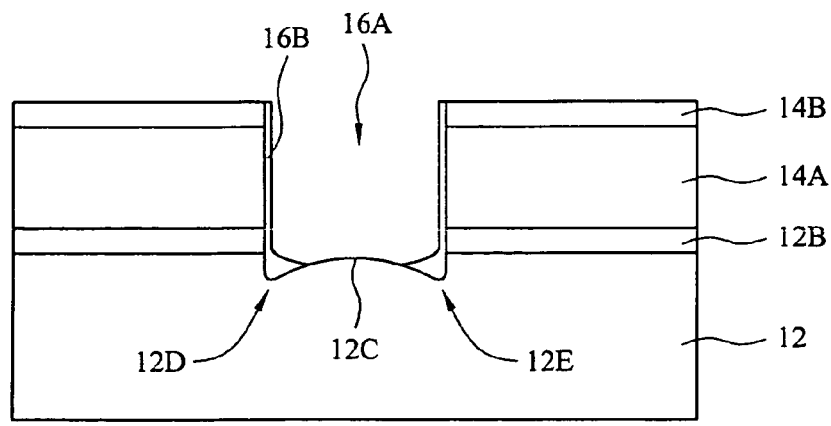

Referring to FIG. 1C, in an important aspect of the invention, the photoresist layer 16 is removed, for example by a wet stripping or dry ashing process, followed by an overetch process to fully expose of the semiconductor (e.g., silicon) substrate 12 at the bottom of the opening 16A and to define an upper portion of the STI opening including forming polymer deposits e.g., layer 16B, to fill in recessed areas 12D and 12E at the opening sidewalls prior to the main STI trench etching step. Preferably, the overetch process is carried out with a fluorohydrocarbon etching chemistry preferably having a carbon to fluorine (C/F) atomic ratio of greater or equal to about ⅓, more preferably greater than about ½. For example the fluorohydrocarbon etching chemistry may include one or more of $CHF_3$, $CH_2F_2$, and $C_2H_4F_2$, preferably including at least $CHF_3$. During the overetch process a polymer layer 16B is formed insitu to include preferential deposition at the opening sidewall to include filling in recessed areas e.g. 12D and 12E to be about level with the surface portion 12C. For example, the surface portion 12C is etched at the convex upward center portion (e.g., reducing a radius of curvature) while at least partially filling in recessed areas 12D and 12E at the sidewalls and bottom portions, preferably to approach a level opening bottom.

Figure 1D:
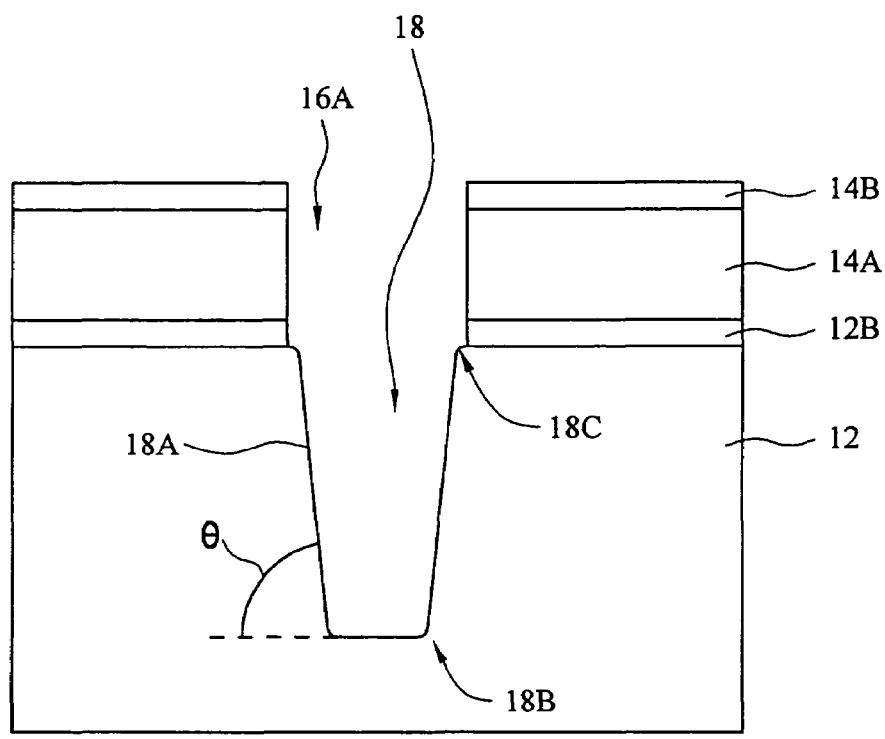

Referring to FIG. 1D, an STI trench opening 18 is then dry etched into the silicon substrate to a depth between about 100 Angstroms and about 5000 Angstroms, preferably forming sloped sidewall portions, e.g., 18A having an angle, theta, with respect to the plane of the major surface (process surface) of the substrate 12 preferably between about 85 and 89 degrees, the uppermost portion of the trench opening 18 being wider than the bottom portion. A conventional etching chemistry, including for example, $Cl_2$, HBr, and $O_2$ is preferably used to dry etch the trench opening 18 unto the substrate 12 to from a shallow trench isolation (STI) opening (trench opening) 18.

Advantageously, during the trench etching process, trench bottom corners e.g., 18B (e.g. negative radius of curvature or concave with respect to the trench opening), and trench top corners e.g., 18C (e.g. positive radius of curvature or convex with respect to the trench (STI) opening) are formed having rounded corners with improved profiles due to the polymer deposition at the sidewall portions of the opening 16A during the overetch process. For example, it has been found that the polymer deposition during the overetch process serves to prevent sharpening of the top corners e.g., 18C during the main etch process and contributes to increased rounding at the trench bottom corner e.g., 18B. For example, micro-trenching along the opening sidewalls, especially at the top and bottom corner portions is avoided compared to prior art processes.

Figure 1E:
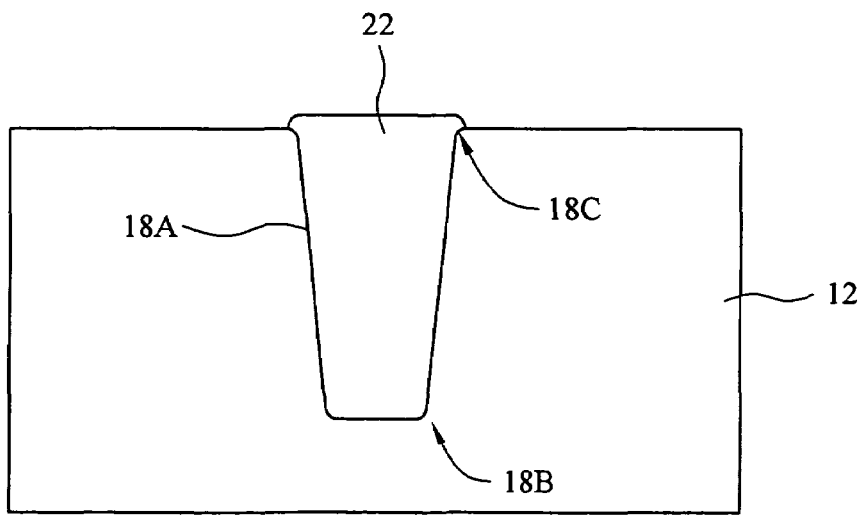

Referring to FIG. 1E, conventional process are then carried out to complete the formation of the STI trench, for example, the hardmask layer 14A may be removed by an $H_3PO_4$ wet etching process prior to or following forming trench liners (not shown) and backfilling with a CVD silicon oxide e.g., 22. For example, the trench opening 18 is lined with one or more liner layers (not shown) e.g., nitride and/or oxide followed by backfilling the trench opening 18 with one or more layers, e.g., 22 of STI oxide (silicon oxide), e.g., undoped silicate glass (USG) formed by a CVD process. A planarization process is then performed to remove excess STI oxide to stop on an uppermost nitride layer e.g., hardmask layer 14A. The hardmask layer 14A, e.g., silicon nitride, is then removed by a conventional wet etching process, for example using hot $H_3PO_4$, followed by a dilute HF wet dip to remove the pad oxide layer 12B, preferably leaving a portion of the STI oxide protruding above the substrate 12 surface.

Thus, according to the method of the present invention STI trench rounded corners at the top and bottom portions are produced with improved rounding profiles which advantageously reduces electric field strength at the corners thereby reducing current (charge) leakage and device degradation. The electrical, properties of completed MOSFET devices formed in active areas adjacent the STI structures formed according to preferred embodiments are thereby improved including threshold voltage stability and off-state current levels and stability. The method of the present invention is particularly useful for forming low Voltage and low power devices.

Figure 2:
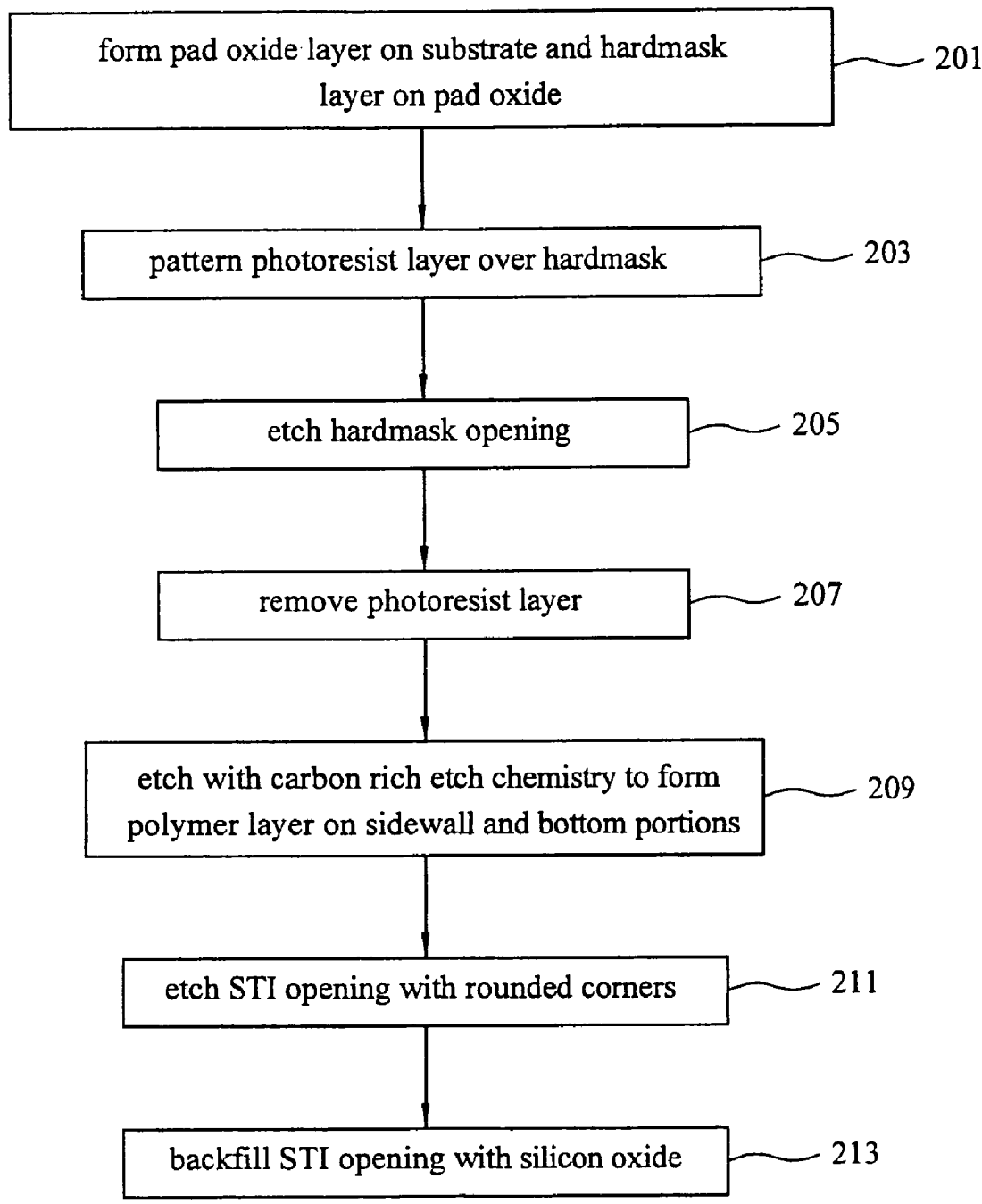
FIG. 2 is a process flow diagram including several embodiments of the present invention.

Referring to FIG. 2 is a process flow diagram including several embodiments of the present invention for forming a shallow trench isolation (STI) structure. In process 201 a pad oxide layer on a semiconductor substrate and a hardmask layer on the pad oxide layer including an uppermost ARC layer are formed. In process 203, a photoresist layer is formed over the hardmask layer and patterned for etching an STI trench opening. In process 205, a first etching process is carried to etch through a thickness of the ARC layer, the hardmask layer, and at least a portion of the pad oxide layer. In process 207, the photoresist layer is removed. In process 209, an overetch process with a carbon rich etching chemistry is carried to completely expose the silicon substrate and defining the bottom opening profile including depositing a polymer layer on the sidewall and bottom portions of the opening. In process 211, the STI opening is etched to include forming rounded bottom corners and top corners. In process 213, the STI structure is completed by conventional processes including backfilling with silicon oxide.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming a shallow trench isolation (STI) structure comprising the steps of:
   providing a semiconductor substrate comprising an overlying silicone oxide layer on the semiconductor substrate and a hardmask layer on the silicon oxide layer;
   dry etching in a first etching process to form a patterned hardmask opening for ecthing an STI opening, said hardmask opening formed to expose at least a portion of the semiconductor substrate to form a convex upward surface at the bottom of the hardmask opening and recessed areas along the sidewalls;
   dry etching in a second etching process the semiconductor subsrate to form an upper portion of an STI opening to form a polymer layer along sidewall portions of the STI opening; and,
   dry etching in a third ecthing process the STI opening to form rounded bottom corners and rounded top corners.

2. The method of claim 1, wherein the step of dry etching in a first etching process comprises patterning a photoresist layer over the hardmask layer.

3. The method of claim 1, wherein the wherein the step dry etching in a second etching process comprises the polymer layer filling in at least a portion of the recessed areas.

4. The method of claim 1, wherein the step dry etching in a second etching process comprises first removing a photoresist layer overlying the hardmask layer.

5. The method of claim 1, wherein the step dry etching in a second etching process comprises a fluorohydrocarbon etching chemistry having a carbon to fluorine ratio of greater than about 1 to 3.

6. The method of claim 1, wherein the step dry etching in a second etching process comprises supplying fluorohydrocarbon plasma source gases selected from the group consisting of $CHF_3$, $CH_2F_2$, and $C_2H_4F_2$.

7. The method of claim 1, wherein the semiconductor substrate comprises materials selected from the group consisting of silicon, silicon on insulator (S01), SiGe, and GaAs.

8. The method of claim 1, wherein the hardmask layer is selected from the group consisting of silicon oxynitride and silicon nitride.

9. The method of claim 1, further comprising an antireflective coating (ARC) layer formed over the hardmask layer.

10. The method of claim 1, wherein the STI opening is formed with sloped sidewalls having an angle of between about 85 degrees and about 89 degrees with respect to a major surface of the semiconductor substrate.

11. A method for forming a shallow trench isolation (STI) structure comprising the steps of:
    providing a semiconductor substrate comprising a silicon oxide layer on the semiconductor substrate and a hardmask layer on the silicon oxide layer;
    dry etching in a first etching process to form a patterned hardmask opening for etching an STI opening;
    dry etching in a second etching process the semiconductor substrate to form an upper portion of an STI opening to form a polymer layer along sidewall portions of the STI opening, wherein the second etching process comprises a fluorohydrocarbon etching chemistry having a carbon to fluorine ratio of greater than about 1 to 3; and,
    dry etching in a third etching process the STI opening to form rounded bottom corners and rounded top corners.

12. The method of claim 11, wherein the step of dry etching in a first etching process comprises forming a convex upward surface at the bottom of the hardmask opening and recessed areas along the sidewalls.

13. The method of claim 12, wherein the polymer layer fills in the recessed areas along the sidewall portions to form about a level bottom portion of the upper portion of an STI opening.

14. The method of claim 11, wherein the step dry etching in a second etching process comprises supplying fluorohydrocarbon plasma source gases selected from the group consisting of $CHF_3$, $CH_2F_2$, and $C_2H_4F_2$.

15. The method of claim 11, wherein the semiconductor substrate comprises materials selected from the group consisting of silicon, silicon on insulator (SOI), SiGe, and GaAs.

16. The method of claim 11, wherein the hardmask layer is selected from the group consisting of silicon oxynitride and silicon nitride.

17. The method of claim 11, further comprising an antireflective coating (ARC) layer formed over the hardmask layer.

18. The method of claim 11, wherein the STI opening is formed with sloped sidewalls having an angle of between about 85 degrees and about 89 degrees with respect to a major surface of the semiconductor substrate.

19. A method for forming a shallow trench isolation (STI) structure comprising the steps of:
    providing a semiconductor substrate comprising an overlying silicon oxide layer on the semiconductor substrate and a hardmask layer on the silicon oxide layer;
    dry etching in a first etching process to form a patterned hardmask opening for etching an STI opening;
    dry etching in a second etching process the semiconductor substrate to form an upper portion of an STI opening to form a polymer layer along sidewall portions of the STI opening, said second etching process comprising supplying fluorohydrocarbon plasma source gases selected from the group consisting of $CHF_3$, $CH_2F_2$, and $C_2H_4F_2$; and,
    dry etching in a third etching process the STI opening to form rounded bottom corners and rounded top corners.

20. The method of claim 19, wherein the hardmask opening is formed to expose at least a portion of the semiconductor substrate to form a convex upward surface at the bottom of the hardmask opening and recessed areas along the sidewalls.

* * * * *